(12) United States Patent
Miyashita et al.

(10) Patent No.: US 9,561,762 B2
(45) Date of Patent: Feb. 7, 2017

(54) ELECTRIC UNIT

(71) Applicant: NISSAN MOTOR CO., LTD., Yokohama-shi, Kanagawa (JP)

(72) Inventors: Masahiro Miyashita, Yokohama (JP); Hirofumi Shimizu, Atsugi (JP); Akihiro Katakami, Fujisawa (JP); Hiroaki Takahashi, Yokohama (JP)

(73) Assignee: NISSAN MOTOR CO., LTD., Yokohama-Shi (JP)

( * ) Notice: Subject to any disclaimer, the term of this patent is extended or adjusted under 35 U.S.C. 154(b) by 285 days.

(21) Appl. No.: 14/381,881

(22) PCT Filed: Feb. 22, 2013

(86) PCT No.: PCT/JP2013/054493
§ 371 (c)(1),
(2) Date: Aug. 28, 2014

(87) PCT Pub. No.: WO2013/129247
PCT Pub. Date: Sep. 6, 2013

(65) Prior Publication Data
US 2015/0043132 A1 Feb. 12, 2015

(30) Foreign Application Priority Data
Feb. 29, 2012 (JP) ................................ 2012-043883
Sep. 21, 2012 (JP) ................................ 2012-208358

(51) Int. Cl.
*B60R 16/03* (2006.01)
*B60L 7/14* (2006.01)
(Continued)

(52) U.S. Cl.
CPC ............... *B60R 16/03* (2013.01); *B60L 3/003* (2013.01); *B60L 7/14* (2013.01); *B60L 11/1803* (2013.01);
(Continued)

(58) Field of Classification Search
CPC .. B60R 16/03; H05K 7/20845; B60L 11/1803; B60L 7/14; B60L 3/003; B60L 2210/10; B60L 2240/36; Y02T 10/7005; Y02T 10/7216
See application file for complete search history.

(56) References Cited

U.S. PATENT DOCUMENTS

| 2006/0232942 | A1 | 10/2006 | Nakatsu et al. |
| 2013/0128643 | A1 | 5/2013 | Shinohara et al. |
| 2013/0176761 | A1* | 7/2013 | Hattori ................ B60L 11/14 363/131 |

FOREIGN PATENT DOCUMENTS

| JP | 2006-286676 A | 10/2006 |
| JP | 2011-134654 A | 7/2011 |

(Continued)

*Primary Examiner* — Jung Kim
*Assistant Examiner* — James Evans
(74) *Attorney, Agent, or Firm* — Foley & Lardner LLP

(57) ABSTRACT

An electric unit is attached to a power unit including a motor-generator, the power unit being disposed in a power unit mounting chamber that is formed at a front of a vehicle and separated from a vehicle cabin by a partition wall. The electric unit includes: a high-voltage component including an electric power conversion device of a relatively high voltage, the electric power conversion device converting an electric power between a DC electric power and an AC electric power for the motor-generator; and a low-voltage component including a control device of a relatively low voltage, the control device controlling the electric power conversion device. The high-voltage component and the low-voltage component are accommodated in an accommodation case. Inside the accommodation case, the high-voltage component is arranged toward the front of the vehicle, and the low-voltage component is arranged toward a rear of the vehicle.

6 Claims, 6 Drawing Sheets

FRONT DIRECTION

(51) Int. Cl.
  *B60L 3/00* (2006.01)
  *B60L 11/18* (2006.01)
  *H05K 7/20* (2006.01)
(52) U.S. Cl.
  CPC ....... *H05K 7/20845* (2013.01); *B60L 2210/10* (2013.01); *B60L 2240/36* (2013.01); *Y02T 10/7005* (2013.01); *Y02T 10/7216* (2013.01)

(56) References Cited

FOREIGN PATENT DOCUMENTS

| JP | 2012-5323 A | 1/2012 |
|---|---|---|
| WO | WO 98/28833 A2 | 7/1998 |

\* cited by examiner

FRONT DIRECTION

ELECTRIC UNIT

TECHNICAL FIELD

The present invention relates to an electric unit that is mounted on an electric vehicle such as an electric car and a hybrid vehicle, and includes a built-in high-voltage component such as an electric power conversion device.

BACKGROUND ART

JP2011-134654A describes a vehicle-mounted electric unit that is provided in an electric vehicle, such as an electric car and a hybrid vehicle, to suppress a built-in high-voltage component from being externally exposed due to an external impact force.

The vehicle-mounted electric unit described in JP2011-134654A includes an accommodation case and a connector. A terminal block is arranged inside the accommodation case, and an outlet is formed on an external surface of the accommodation case. The connector is inserted into the outlet of the accommodation case and connected to the terminal block. The connector is arranged such that it can be detached from the accommodation case when an external impact force is applied. This vehicle-mounted electric unit also includes an insulating wall portion that is arranged inside the accommodation case so as to obstruct the outlet when the connector is detached.

SUMMARY OF INVENTION

However, with the technique described in JP2011-134654A, a component dedicated to interruption of contact with a high-voltage component inside the electric unit is installed, thereby undesirably increasing the size of the electric unit in the up-down direction or the front-rear and left-right directions.

The present invention was developed in view of such a problem and aims to provide an electric unit that suppresses a high-voltage component from being externally exposed without size increase.

One aspect of the present invention relates to an electric unit attached to a power unit disposed in a power unit mounting chamber that is formed at a front of a vehicle and separated from a vehicle cabin by a partition wall. The electric unit includes: a high-voltage component including an electric power conversion device of a relatively high voltage, the electric power conversion device converting an electric power between a DC electric power and an AC electric power for a motor-generator; and a low-voltage component including a control device of a relatively low voltage, the control device controlling the electric power conversion device. The high-voltage component and the low-voltage component are accommodated in an accommodation case. Inside the accommodation case, the high-voltage component is arranged toward the front of the vehicle, and the low-voltage component is arranged toward a rear of the vehicle.

The embodiments and advantages of the present invention will be described below in detail with reference to the attached drawings.

DESCRIPTION OF EMBODIMENTS

The following describes an electric unit of the present invention based on various embodiments.

First Embodiment

Figure 1:
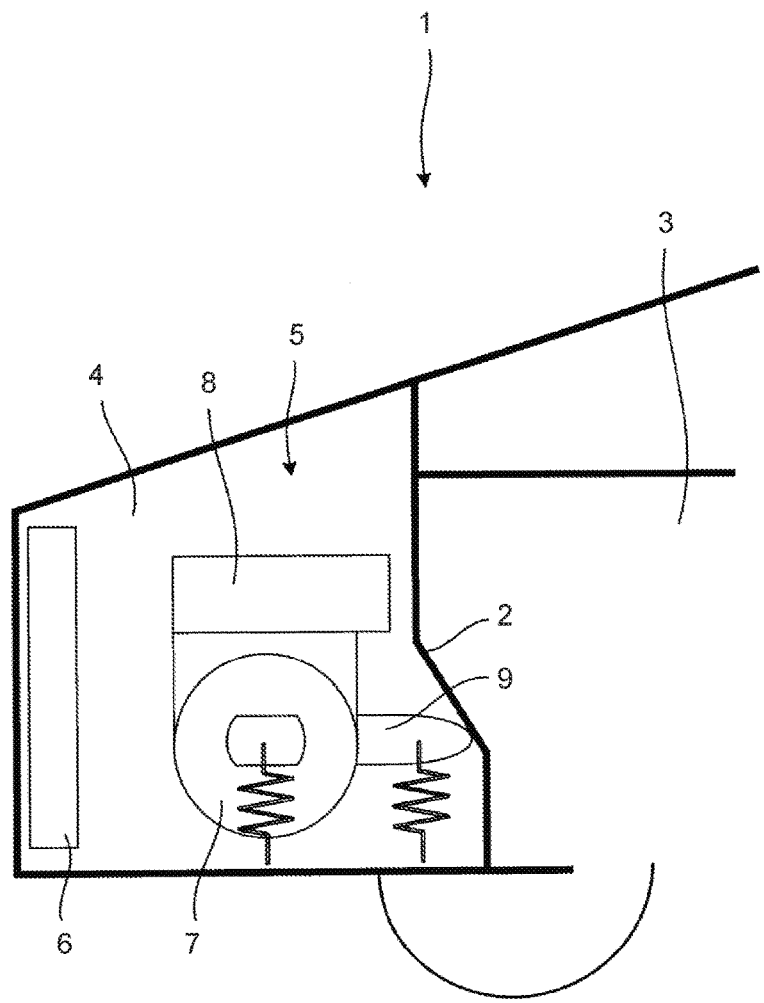
FIG. 1 is a side view showing the state where an electric unit according to a first embodiment of the present invention is mounted on a vehicle.
Figure 1:
Figure 2:
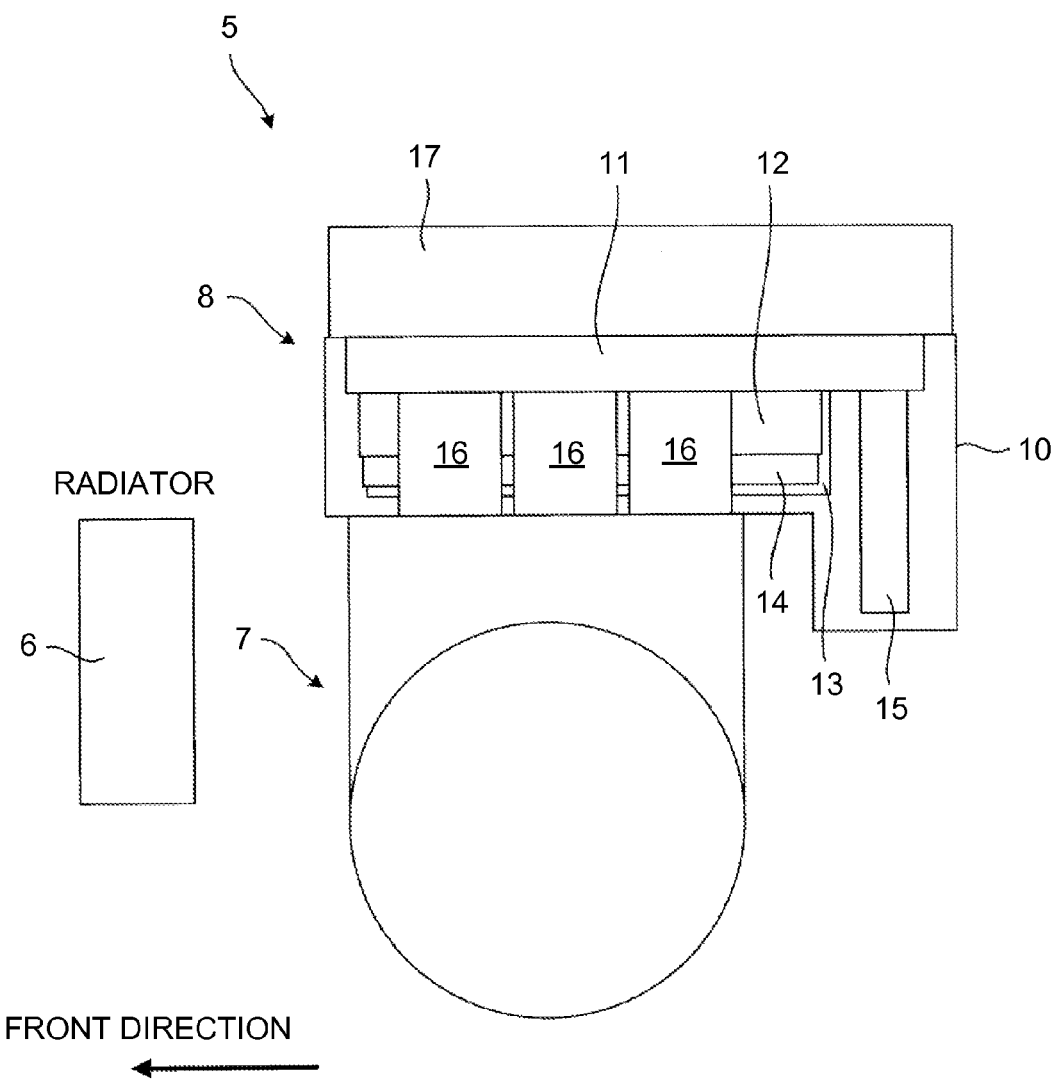
FIG. 2 is a schematic configuration diagram of a power unit according to the first embodiment of the present invention.

FIG. 1 is a side view showing the state where a vehicle-mounted electric unit according to a first embodiment of the present invention is mounted on a vehicle. FIG. 2 is a schematic configuration diagram of a power unit according to the first embodiment of the present invention. In FIG. 1, a vehicle body 1, which is an electric vehicle or a hybrid vehicle, has a power unit mounting chamber 4 at the front of the vehicle body 1. The power unit mounting chamber 4 is separated from a vehicle cabin 3 by a partition wall 2. A power unit 5 for driving the vehicle, as well as a radiator 6 for cooling the power unit 5, is disposed in the power unit mounting chamber 4.

The power unit 5 is composed of a motor-generator 7 and an electric unit 8. The electric unit 8 is fixedly arranged above the motor-generator 7, supplies a battery electric power to the motor-generator 7, and includes an electric power conversion device for charging a battery with a regenerative electric power of the motor-generator 7. A transaxle 9 that transmits power to the wheels is attached to the motor-generator 7. The power unit 5 and the transaxle 9 are integrally joined and elastically mounted on the vehicle body 1.

The electric power conversion device of the electric unit 8 includes a DC-to-DC converter that increases the voltage of a DC electric power supplied from the battery, a smoothing capacitor that smoothes the DC electric power with the increased voltage, and an inverter that converts the DC electric power with the increased voltage into a polyphase AC electric power and supplies the polyphase AC electric power to the motor-generator 7. The DC-to-DC converter and the inverter of the electric power conversion device are composed of a plurality of switching power elements (for example, insulated-gate bipolar transistors, commonly IGBTs), and are connected by heavy electric cables. The inverter and the motor-generator 7 are joined via bus bars. The electric power conversion device performs electric power conversion as follows: a regenerative electric power generated by the motor-generator 7 is converted into a DC electric power, and the battery is charged with the DC electric power. The electric unit 8 includes drivers for actuating the DC-to-DC converter and the inverter of an electric power conversion system, and a control circuit for controlling these drivers.

Power modules 12 are built inside an accommodation case 10 of the electric unit 8 in such a manner that the power modules 12 are supported on a power module board (PM board) 11 serving as a support base. The power modules 12 are made up of the plurality of switching power elements that compose the DC-to-DC converter and the inverter of the electric power conversion device. A smoothing capacitor 13, a driver board 14, and a control board 15 are supported on the power module board 11. The driver board 14 serves as a driving circuit for the power modules 12, and the control board 15 serves as a control circuit for controlling a driving circuit for the driver board 14. Bus bars 16 for joining the plurality of power modules 12 and input/output terminals of the motor-generator 7 are built inside the accommodation case 10. A cooler 17 for cooling the power modules 12 is arranged on a back surface of the power module board 11.

Figure 3:
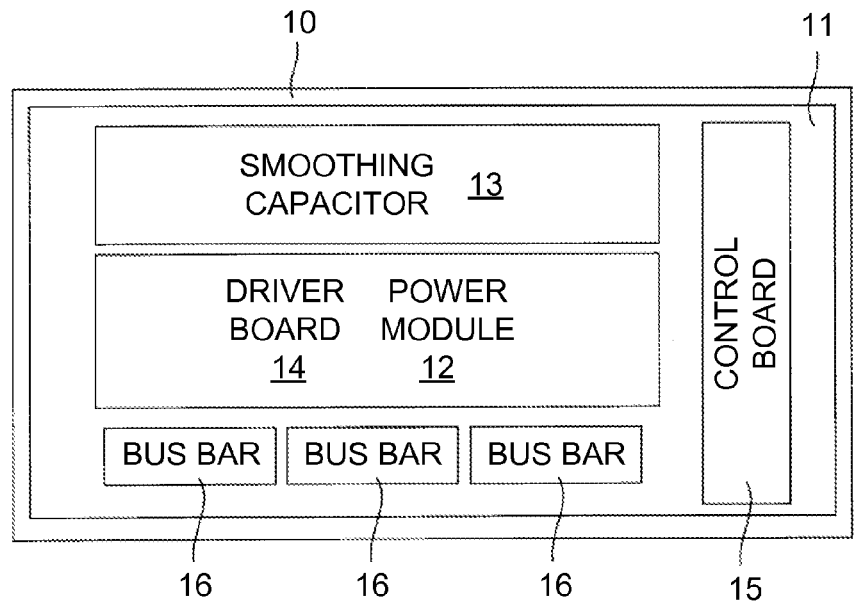
FIG. 3 is a plan view showing the electric unit representing the first embodiment of the present invention.
Figure 4:
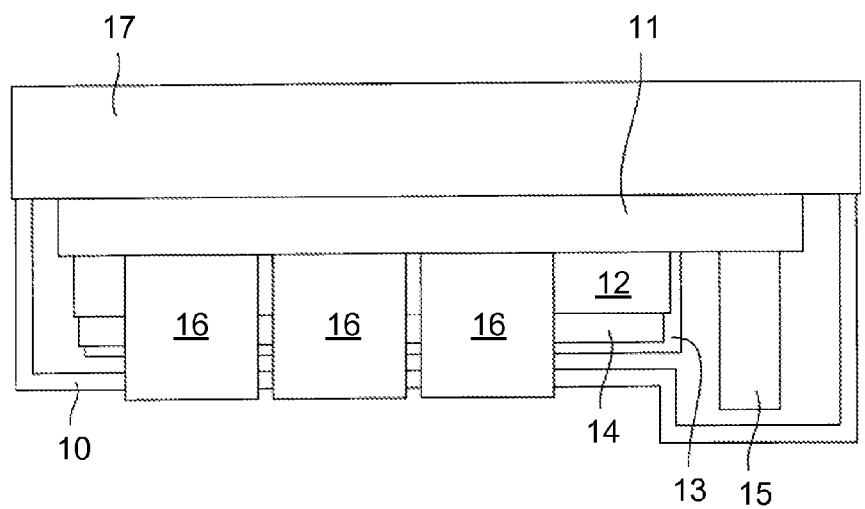
FIG. 4 is a side view showing the electric unit according to the first embodiment of the present invention.

FIGS. 3 and 4 show configurations inside the accommodation case 10 of the electric unit 8. The cooler 17 is provided to the electric unit 8. A bottom portion of the accommodation case 10 is fixedly arranged on top of the cooler 17. Inside the accommodation case 10, the power module board 11 serving as the support base is arranged such that the back surface thereof is in contact with the cooler 17. On the power module board 11, the plurality of power modules 12 are arranged at a central position. The driver board 14 is arranged directly on the plurality of power modules 12. Furthermore, the smoothing capacitor 13, the bus bars 16, and the control board 15 are arranged on the power module board 11 in such a manner as to surround the driver board 14. The smoothing capacitor 13 is located on one side and the bus bars 16 are located on the other side in the left-right direction. The control board 15 is located posterior to them.

Furthermore, the smoothing capacitor 13, the control board 15, and the bus bars 16 form a squared-C (U) shape, and are arranged on the power module board 11 in such a manner as to surround the power modules 12 and the driver board 14. An opening of the squared-C (U) shape is at the front side of the vehicle. Heavy electric cables, not shown, for connecting the smoothing capacitor 13, the power modules 12, and the driver board 14 are arranged on the driver board 14 inside the squared-C (U) shape. Signal cables, not shown, for exchanging control signals with the driver board 14 and other boards described above are arranged for the control board 15.

The electric unit 8 is configured as follows: after the accommodation case 10, inside which the above-described components are built, is reversed in the up-down direction, an opening of the accommodation case 10 is integrally fixed to a housing of the motor-generator 7, and tips of the bus bars 16 projecting downward are connected to the terminals of the motor-generator 7, as shown in FIG. 2. The cooler 17 located on top of the accommodation case 10 is connected to the radiator 6 via a pipe, which is not shown. A coolant that has been cooled by the radiator 6 is supplied in circulation, thereby cooling the inside of the electric unit 8 from the power module board 11 side.

The control board 15 is formed such that a height dimension thereof is larger than a height dimension of a high-voltage component composed of the smoothing capacitor 13, the power modules 12, the driver board 14, and the bus bars 16 arranged in front of the control board 15. A height dimension of a portion of the accommodation case 10 is increased so as to accommodate the control board 15 that is formed to have a large height dimension. The control board 15 may be formed such that a width dimension thereof is larger than a width dimension of the high-voltage component composed of the smoothing capacitor 13, the power modules 12, the driver board 14, and the bus bars 16 arranged in front of the control board 15.

The following describes an operation for the case where the vehicle mounted with the above-configured electric unit 8 attached to the motor-generator 7 undergoes a frontal collision.

When the vehicle undergoes a frontal collision, the radiator 6 arranged at the front of the vehicle is thrust rearward. If the impact of the collision is large, the radiator 6 may hit the power unit 5, or the power unit 5 may be thrust further rearward and hit the partition wall 2 delimiting the posterior vehicle cabin 3.

However, there is a large space in front of the electric unit 8, and the radiator 6 is lower in stiffness than the electric unit 8. Therefore, even if the radiator 6 interferes with the electric unit 8, the accommodation case 10 of the electric unit 8 does not break due to the radiator 6 exerting a role of a buffer. Furthermore, when the frontal collision takes place obliquely from above, the cooler 17, which is arranged above the accommodation case 10 of the electric unit 8, exerts a role of a buffer against the collision, thereby preventing the high-voltage component inside the electric unit 8, such as the electric power conversion device, from being externally exposed.

On the other hand, the partition wall 2, which is formed to be higher in stiffness than the electric unit 8, is closely arranged posterior to the electric unit 8. That is to say, the electric unit 8 and the partition wall 2 have a narrow space therebetween. Furthermore, in this space, no member is arranged that functions as a buffer. Therefore, if the electric unit 8 interferes with the partition wall 2, there is a risk that a rear portion of the accommodation case 10 of the electric unit 8 will be fractured.

However, inside the accommodation case 10 of the electric unit 8, a low-voltage component made up of the control board 15 is arranged on a side toward the rear of the vehicle. The voltage/current values of the low-voltage component are smaller than those of the high-voltage component. A high-voltage component group is arranged in front of the control board 15. The high-voltage component group is made up of the power modules 12, the driver board 14, the smoothing capacitor 13, the bus bars 16, and the heavy electric cables connecting these components. Note that the power modules 12 and the driver board 14 are interposed between the smoothing capacitor 13 and the bus bars 16 in the left-right direction.

The high-voltage component group and the low-voltage component are thus arranged in the front-rear direction. Therefore, even if the rear portion of the accommodation case 10 of the electric unit 8 is fractured, the control board 15, i.e., the low-voltage component constitutes a shield wall ahead of the high-voltage component group, hence exerting a role as a buffer. In this case, the control board 15, which is located inside a fractured region of the accommodation case 10, can protect the high-voltage component including the heavy electric cables and the like, prevent the high-voltage component from being externally exposed, and interrupt external contact with the high-voltage component.

Furthermore, in the case where the control board 15 is formed such that a height dimension thereof is larger than a height dimension of the high-voltage component composed of the smoothing capacitor 13, the power modules 12, the driver board 14, the bus bars 16, the heavy electric cables, and the like arranged in front of the control board 15, even if the rear portion of the accommodation case 10 of the electric unit 8 is fractured, the control board 15, i.e., the low-voltage component further enhances its function as a shield wall ahead of the high-voltage component group. As a result, the control board 15 can protect the high-voltage component from the fractured region, further prevent the high-voltage component from being externally exposed, and achieve better interruption of external contact with the high-voltage component.

The present embodiment can achieve the following effects.

(A) An electric unit 8 is attached to a power unit 5 including a motor-generator 7, the power unit 5 being disposed in a power unit mounting chamber 4 that is formed at a front of a vehicle and separated from a vehicle cabin 3 by a partition wall 2. The electric unit 8 includes: a high-voltage component including an electric power conversion device of a relatively high voltage, the electric power conversion device converting an electric power between a DC electric power and an AC electric power for the motor-generator 7; and a low-voltage component including a control device of a relatively low voltage, the control device controlling the electric power conversion device. The electric unit 8 is accommodated in an accommodation case 10. Inside the accommodation case 10, the high-voltage component is arranged toward the front of the vehicle, and the low-voltage component is arranged toward a rear of the vehicle. That is to say, if the electric unit 8, together with the power unit 5, is thrust toward the rear of the vehicle and hits the partition wall 2 delimiting the vehicle cabin 3 at the time of a collision, an input impact accelerating from the rear side toward the front of the vehicle is applied to the electric unit 8. However, inside the accommodation case 10 of the electric unit 8, the low-voltage component is arranged at a position toward the rear of the vehicle so as to oppose the input impact, whereas the high-voltage component is arranged at a position toward the front of the vehicle. Therefore, the low-voltage component functions as a buffer for the high-voltage component. As a result, even if a crack is formed in the accommodation case 10, the high-voltage component can be prevented from being exposed without increasing the unit size.

(B) The high-voltage component including the electric power conversion device is composed of a power module 12 including a plurality of switching power elements, a smoothing capacitor 13, a driver board 14, and a bus bar 16 connecting the power module 12 and an input/output terminal of the motor-generator 7. The low-voltage component including the control device is composed of a control board 15. The power module 12 and the driver board 14 are arranged in a stack at a central position of a power module board 11 that constitutes a bottom portion of the accommodation case 10 of the electric unit 8. The bus bar 16 and the smoothing capacitor 13 are arranged on the power module board 11 respectively on one side and the other side in a left-right direction of the vehicle. The control board 15 is arranged on the power module board 11 so as to be located more toward the rear of the vehicle than the power module 12, the driver board 14, the bus bar 16, and the smoothing capacitor 13 are. A resultant assembly is turned upside down and an opening of the accommodation case 10 is joined to a housing of the motor-generator 7. A cooler 17 is joined to an upward back surface of the power module board 11. That is to say, if the electric unit 8, together with the power unit 5, is thrust toward the rear of the vehicle and hits the partition wall 2 delimiting the vehicle cabin 3 at the time of the collision of the vehicle, an input impact accelerating from the rear side toward the front of the vehicle is applied to the electric unit 8. The control board 15, i.e., the low-voltage component is located toward the rear of the vehicle so as to oppose the impact input at the time of the collision of the vehicle (on the front side with respect to the input impact), whereas the high-voltage component group is located more toward the front of the vehicle than the control board 15 is (on the rear side with respect to the input impact). Therefore, the control board 15 functions as a buffer for the high-voltage component group. As a result, even if a crack is formed in the accommodation case 10, the high-voltage component can be prevented from being exposed without increasing the unit size.

(C) The control board 15 is formed such that a height dimension thereof is larger than a height dimension of the high-voltage component composed of the smoothing capacitor 13, the power modules 12, the driver board 14, the bus bars 16, the heavy electric cables, and the like arranged in front of the control board 15. In this way, even if the rear portion of the accommodation case 10 of the electric unit 8 is fractured, the control board 15, i.e., the low-voltage component further enhances its function as a shield wall ahead of the high-voltage component group. As a result, the control board 15 can protect the high-voltage component from the fractured region, further prevent the high-voltage component from being externally exposed, and achieve better interruption of external contact with the high-voltage component.

Second Embodiment

Figure 5:
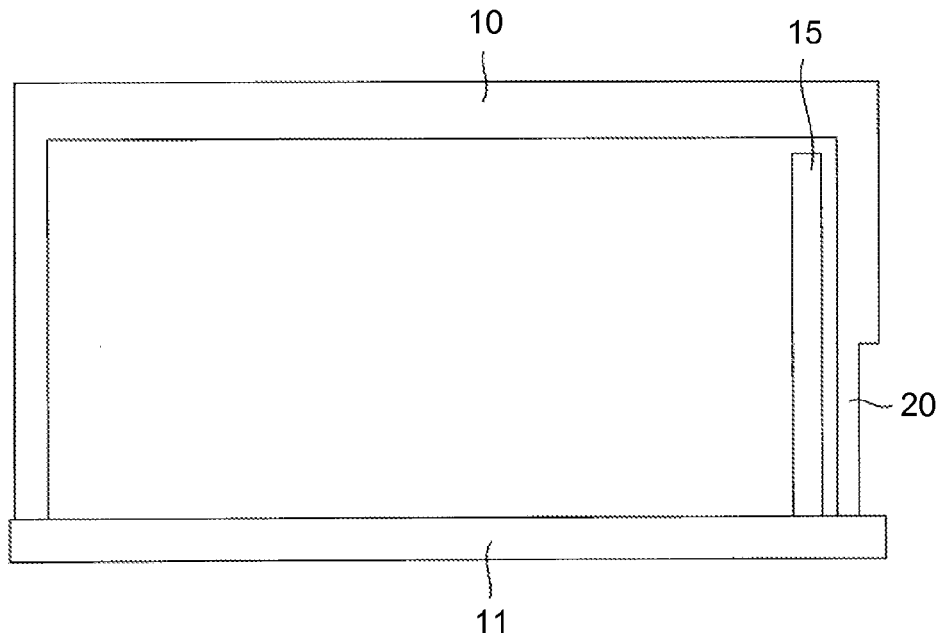
FIG. 5 is a side view showing an electric unit representing a first working example of a second embodiment of the present invention.
Figure 6:
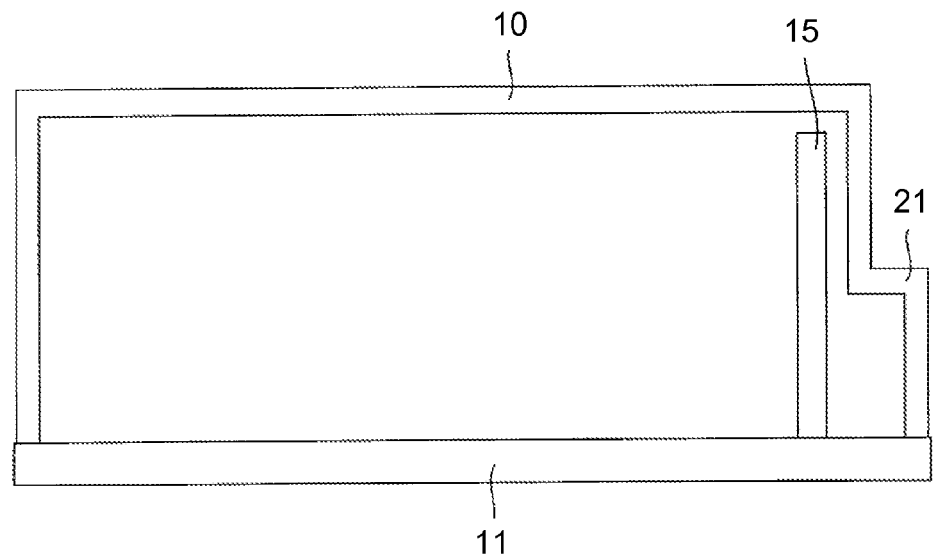
FIG. 6 is a side view showing an electric unit representing a second working example of the second embodiment of the present invention.

FIGS. 5 and 6 show a second embodiment of a vehicle-mounted electric unit of the present invention. Specifically, FIG. 5 is a schematic configuration diagram of an electric unit according to a first working example of the second embodiment, and FIG. 6 is a schematic configuration diagram of an electric unit according to a second working example of the second embodiment. The present embodiment is realized by adding the following configuration to the first embodiment: a rear portion of an accommodation case of an electric unit is partially reduced in stiffness. It should be noted that the devices that are the same as those according to the first embodiment will be given the same reference signs thereas, and a description thereof will be omitted or simplified. In both figures, the illustrated electric unit is reversed in the up-down direction so that the top of the electric unit faces down. When the electric unit is mounted on a motor-generator, it is reversed in the up-down direction.

In an electric unit 8 according to the first working example shown in FIG. 5, a portion of a wall of an accommodation case 10 located toward the rear of a vehicle is provided with a region 20 with a small thickness dimension. The region 20 with the small thickness dimension is low in stiffness than wall portions therearound. Other configurations are similar to those according to the first embodiment.

According to the present working example, when a power unit 5 is pressed against a partition wall 2 delimiting a vehicle cabin 3 at the time of a collision of the vehicle, a rear portion of the electric unit 8 is pressed against the partition wall 2, and an impact is input thereto from the rear of the vehicle. As the region 20 with the small thickness dimension provided in the accommodation case 10 of the electric unit 8 is low in stiffness than wall portions therearound, this region can reliably be fractured upon contact with the partition wall 2. Therefore, by providing the accommodation case 10 with the region 20 with the small thickness dimension in advance, the magnitude of a wall fracture can be identified in advance, and contact with a high-voltage component can be prevented in a more reliable manner if the accommodation case 10 is fractured.

In the present working example, an area in which a fracture occurs at the time of the collision can be further clarified by incorporating the following configuration: a rib that has a larger thickness dimension than a general cross-section is arranged so as to surround the region 20 with the small thickness dimension provided in the accommodation case 10.

In an electric unit 8 according to the second working example shown in FIG. 6, a portion of a wall of an accommodation case 10 located toward the rear of a vehicle projects more rearward than wall portions therearound do. At the time of a collision with a partition wall 2, a region 21 projecting rearward comes into contact with the partition wall 2 sooner than wall portions therearound do. Other configurations are similar to those according to the first embodiment.

According to the present working example, when a power unit 5 is pressed against the partition wall 2 delimiting a vehicle cabin 3 at the time of a collision of the vehicle, a rear portion of the electric unit 8 is pressed against the partition wall 2, and an impact is input thereto from the rear of the vehicle. The region 21 projecting rearward, which is provided in the accommodation case 10 of the electric unit 8, comes into contact with the partition wall 2 sooner than the wall portions therearound do. In this way, the impact from the partition wall 2 can reliably cause this region to be fractured. Therefore, by providing the accommodation case 10 with the region 21 projecting rearward in advance, a region of a wall fracture can be identified in advance, and contact with a high-voltage component can be prevented in a more reliable manner if the accommodation case 10 is fractured.

The present embodiment can achieve the following effects in addition to the effects (A) to (C) achieved by the first embodiment.

(D) A wall region of the accommodation case 10 toward the rear of the vehicle is provided with a region 20 that has a smaller thickness dimension than a wall portion therearound, the wall region interfering with the partition wall 2 at a time of a collision of the vehicle. That is to say, by providing the accommodation case 10 with the region 20 with the small thickness dimension in advance, the magnitude of a wall fracture can be identified in advance, and contact with the high-voltage component can be prevented in a more reliable manner if the accommodation case 10 is fractured.

(E) A wall region of the accommodation case 10 toward the rear of the vehicle is provided with a region 21 that projects more toward the rear of the vehicle than a wall portion therearound does, the wall region interfering with the partition wall 2 at a time of a collision of the vehicle. That is to say, by providing the accommodation case 10 with the region 21 projecting rearward in advance, a region of a wall fracture can be identified in advance, and contact with the high-voltage component can be prevented in a more reliable manner if the accommodation case 10 is fractured.

Third Embodiment

Figure 7:
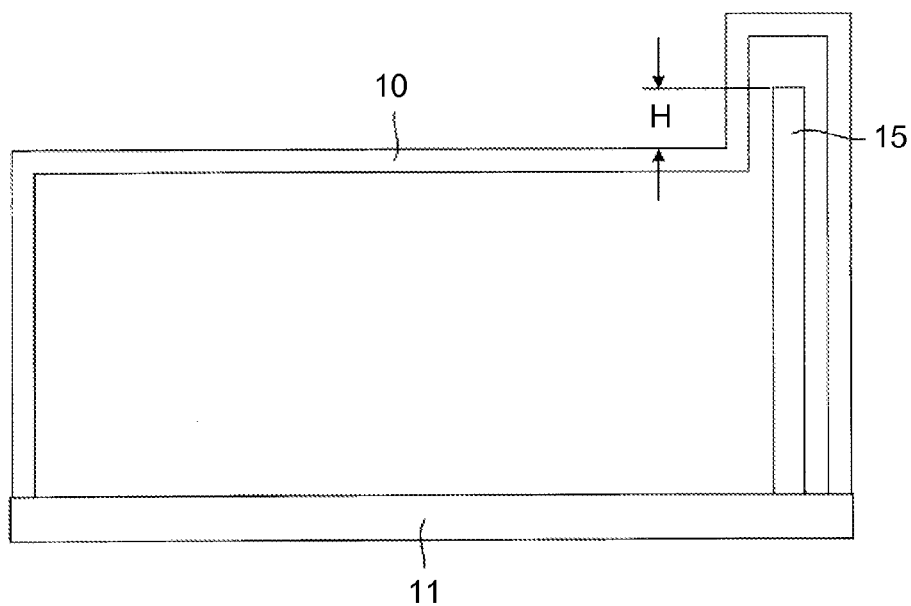
FIG. 7 is a side view showing an electric unit representing a third embodiment of the present invention.
Figure 8:
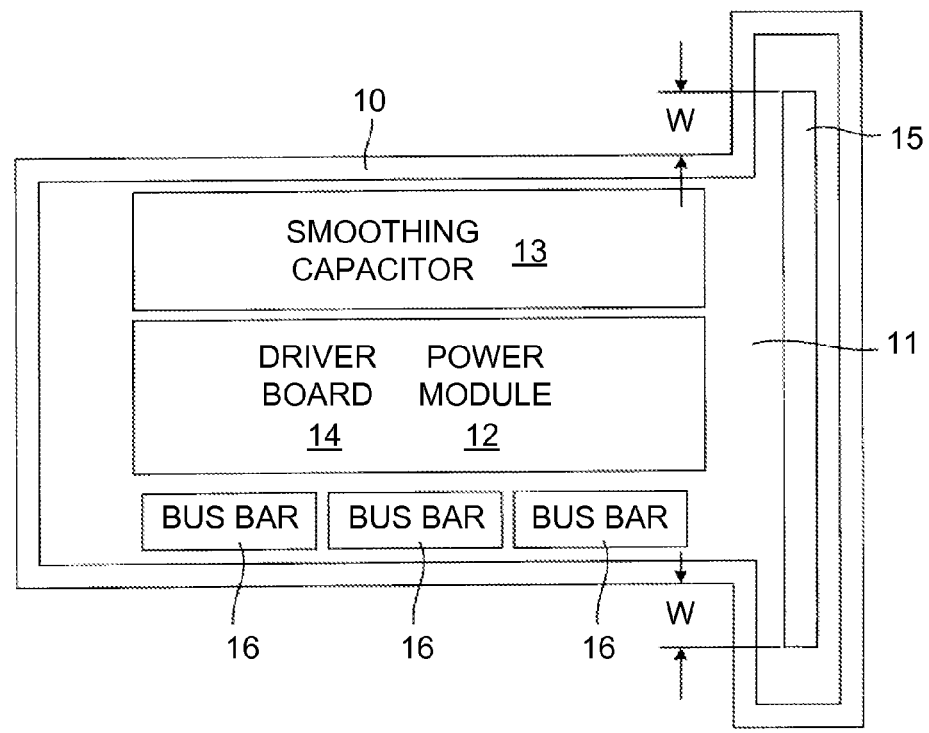
FIG. 8 is a plan view showing the electric unit representing the third embodiment of the present invention.

FIGS. 7 and 8 show a third embodiment of a vehicle-mounted electric unit of the present invention. Specifically, FIG. 7 is a side view showing the vehicle-mounted electric unit, and FIG. 8 is a plan view showing the vehicle-mounted electric unit. The present embodiment is realized by adding the following configuration to the first embodiment: the shape of an accommodation case of an electric unit is changed. It should be noted that the devices that are the same as those according to the first embodiment will be given the same reference signs thereas, and a description thereof will be omitted or simplified. Furthermore, in both figures, the illustrated electric unit is reversed in the up-down direction so that the top of the electric unit faces down, similarly to the second embodiment. When the electric unit is mounted on a motor-generator 7, it is reversed in the up-down direction.

In an electric unit 8 shown in FIGS. 7 and 8, a projected shape of a control board 15 as viewed in the front-rear direction of a vehicle is larger than a projected shape of an accommodation case 10 in a region accommodating a high-voltage component as viewed in the front-rear direction of the vehicle (dimensions H, W). Accordingly, a projected shape of a portion of the accommodation case 10 accommodating the control board 15 with the large projected shape is naturally larger than the projected shape of the accommodation case 10 in the region accommodating the high-voltage component as viewed in the front-rear direction of the vehicle. Other configurations are similar to those according to the first embodiment.

According to the present embodiment, when a power unit 5 is pressed against a partition wall 2 delimiting a vehicle cabin 3 at the time of a collision of the vehicle, a rear portion of the electric unit 8 is pressed against the partition wall 2, and an impact is input thereto from the rear of the vehicle. In the electric unit 8, the control board 15 is arranged on a side toward the rear of the vehicle. The projected shape of the control board 15 is larger than the projected shape of the accommodation case 10 in the region accommodating the high-voltage component as viewed in the front-rear direction of the vehicle. Therefore, even if a portion of the accommodation case 10 toward the rear of the vehicle, which accommodates the control board 15, gets damaged, the control board 15 itself comes into contact with an end portion of the accommodation case 10 in the region accommodating the high-voltage component, thereby constituting a buffer wall for the high-voltage component. This can prevent contact with the high-voltage component in a more reliable manner if the accommodation case 10 is fractured.

The foregoing embodiment has described the control board 15 that is larger, in both of the height direction and the width direction, than the projected shape of the accommodation case 10 in the region accommodating the high-voltage component as viewed in the front-rear direction of the vehicle. Alternatively, the control board 15 may be larger, in one of the height direction and the width direction, than the projected shape of the accommodation case 10 in the region accommodating the high-voltage component as viewed in the front-rear direction of the vehicle.

The present embodiment can achieve the following effect in addition to the effects (A) to (C) achieved by the first embodiment.

(F) The accommodation case 10 has a high-voltage component accommodation portion and a low-voltage accommodation portion in which the high-voltage component and the low-voltage component are accommodated, respectively. The low-voltage component is formed such that at least one of the following conditions is satisfied: a height dimension of the low-voltage component is larger than a height dimension of the high-voltage component accommodation portion; and a width dimension of the low-voltage component is larger than a width dimension of the high-voltage component accommodation portion (dimensions H, W). Therefore, even if a portion of the accommodation case 10 toward the rear of the vehicle, which accommodates the control board 15, gets damaged, the control board 15 itself comes into contact with an end portion of the accommodation case 10 in the region accommodating the high-voltage component, thereby constituting a buffer wall for the high-voltage component. This can prevent contact with the high-voltage component in a more reliable manner if the accommodation case 10 is fractured.

Fourth Embodiment

Figure 9:
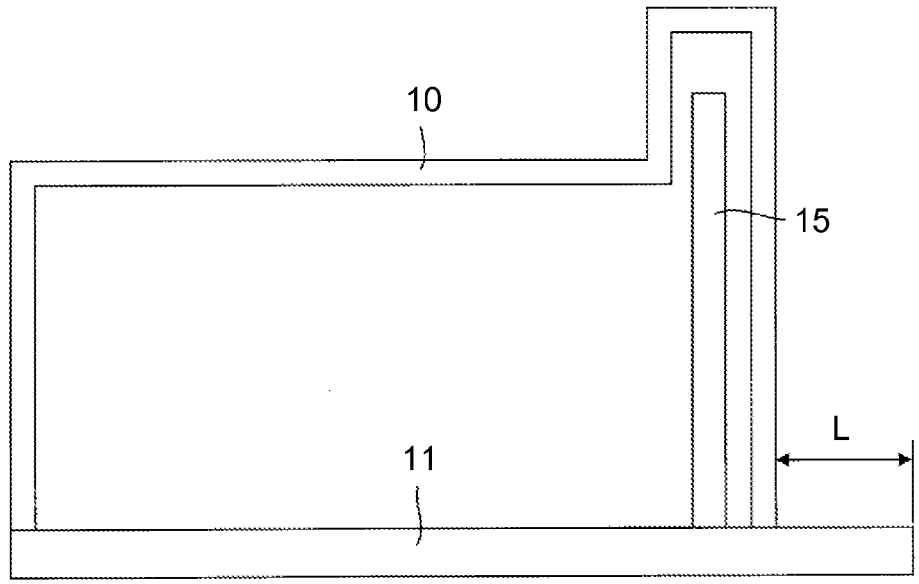
FIG. 9 is a side view showing an electric unit representing a first working example of a fourth embodiment of the present invention.
Figure 10:
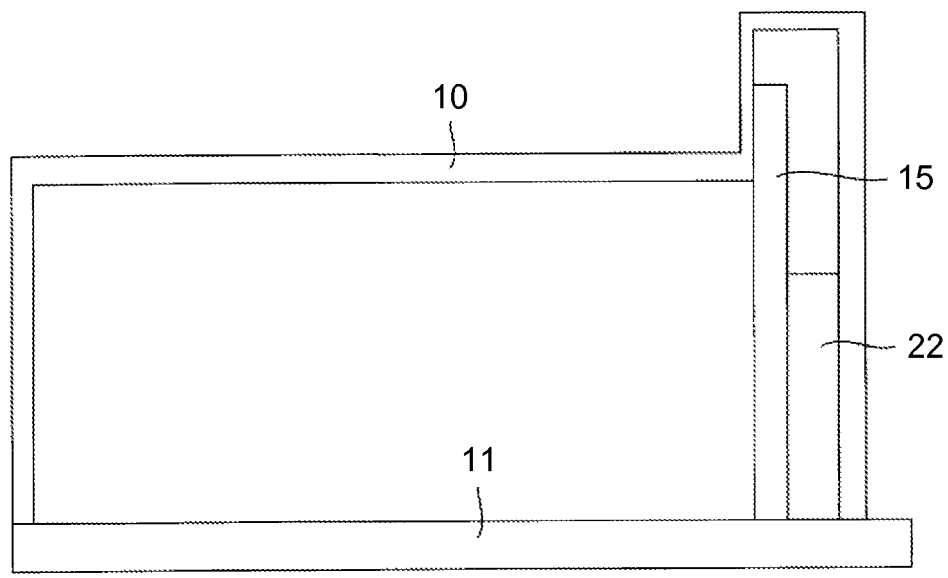
FIG. 10 is a side view showing an electric unit representing a second working example of the fourth embodiment of the present invention.

FIGS. 9 and 10 show a fourth embodiment of a vehicle-mounted electric unit of the present invention. Specifically, FIG. 9 is a schematic configuration diagram of an electric unit according to a first working example of the fourth embodiment, and FIG. 10 is a schematic configuration diagram of an electric unit according to a second working example of the fourth embodiment. The present embodiment is realized by adding the following configuration to the first embodiment: a power module board projects more toward the rear of a vehicle than an accommodation case of an electric unit does. It should be noted that the devices that are the same as those according to the first embodiment will be given the same reference signs thereas, and a description thereof will be omitted or simplified. Furthermore, in both figures, the illustrated electric unit is reversed in the up-down direction so that the top of the electric unit faces down, similarly to the second embodiment. When the electric unit is mounted on a motor-generator 7, it is reversed in the up-down direction.

In the first working example shown in FIG. 9, a power module board 11 of an electric unit 8 is configured to project more toward the rear of the vehicle than an accommodation case 10 does by a predetermined dimension L. Other configurations are similar to those according to the first embodiment.

In the present working example, as a rear end portion of the accommodation case 10 is located more inwardly than a rear end portion of the power module board 11 is by the predetermined dimension L, the accommodation case 10 is allowed leeway from external contact.

Furthermore, on a side of the electric unit 8 toward the rear of the vehicle, the power module board 11 projects more toward the rear of the vehicle than the accommodation case 10 does by the predetermined dimension L. Therefore, when a power unit 5 is pressed against a partition wall 2 delimiting a vehicle cabin 3 at the time of a collision of the vehicle, the projecting power module board 11 of the electric unit 8 is pressed against the partition wall 2, an impact is input thereto from the rear of the vehicle, and the power module board 11 is pushed toward the front of the vehicle. As the power module board 11 is fixed to a housing of the power unit 5 via the accommodation case 10, shearing forces that cause the accommodation case 10 to fall forward are exerted, with regions fixed to the housing of the power unit 5 acting as attachment points, and the power module board 11 acting as an effort. The rear end portion of the accommodation case 10 is moved so as to incline toward the front of the vehicle. Therefore, the rear end portion of the accommodation case 10 can be prevented from getting damaged, and the accommodation case 10 can be prevented from getting fractured. This can reliably prevent exposure of a high-voltage component.

The second working example shown in FIG. 10 has the following configuration: a power module board 11 of an electric unit 8 projects more toward the rear of a vehicle than an accommodation case 10 does by a predetermined dimension, and a connector 22 that supplies an electric power to a control board 15 is arranged between the control board 15 and a rear end side of the accommodation case 10 and is attached directly to the control board 15. Other configurations are similar to those according to the first embodiment.

In the present working example, a rear end portion of the accommodation case 10 is located more inwardly than a rear end portion of the power module board 11 is by a predetermined dimension, and the connector 22 that supplies an electric power to the control board 15 is arranged between the accommodation case 10 and the control board 15. In this way, the accommodation case 10 is allowed leeway from external contact, and the control board 15 and the connector 22 delimit a high-voltage component. Therefore, exposure of the high-voltage component can be further prevented.

In the present working example also, on a side of the electric unit 8 toward the rear of the vehicle, the power module board 11 projects more toward the rear of the vehicle than the accommodation case 10 does by a predetermined dimension. Therefore, when a power unit 5 is pressed against a partition wall 2 delimiting a vehicle cabin 3 at the time of a collision of the vehicle, the projecting power module board 11 of the electric unit 8 is pressed against the partition wall 2, an impact is input thereto from the rear of the vehicle, and the power module board 11 is pushed toward the front of the vehicle. The rear end portion of the accommodation case 10 is moved in the falling direction toward the front of the vehicle. Therefore, the rear end portion of the accommodation case 10 can be prevented from getting damaged, and the accommodation case 10 can be prevented from getting fractured. This can reliably prevent exposure of the high-voltage component.

The present embodiment can achieve the following effects in addition to the effects (A) to (C) achieved by the first embodiment.

(G) The power module board 11 that constitutes the bottom portion of the accommodation case 10 is formed to project more toward the rear of the vehicle than a rear end portion of the accommodation case 10 does. That is to say, as the rear end portion of the accommodation case 10 is located more inwardly than the rear end portion of the power module board 11 is by the predetermined dimension L, the accommodation case 10 is allowed leeway from external contact. At the time of a collision with the partition wall 2, the rear end portion of the accommodation case 10 is moved in the falling direction toward the front of the vehicle. Therefore, the rear end portion of the accommodation case 10 can be prevented from getting damaged, and the accommodation case 10 can be prevented from getting fractured. This can reliably prevent exposure of the high-voltage component.

(H) A connector 22 that supplies an electric power to the control board 15 is provided to the control board 15, the connector 22 being arranged between the control board 15 and a rear end side of the accommodation case 10. In this way, the control board 15 and the connector 22 delimit the high-voltage component. Therefore, exposure of the high-voltage component can be further prevented.

This concludes the description of the embodiments of the present invention. It should be noted that the above-described embodiments merely illustrate a part of application examples of the present invention, and are not intended to restrict a technical scope of the present invention to specific configurations according to the above-described embodiments.

The present application claims the benefit of priority from Japanese Patent Application No. 2012-43883 filed in the Japan Patent Office on Feb. 29, 2012, and from Japanese Patent Application No. 2012-208358 filed in the Japan Patent Office on Sep. 21, 2012. The disclosure of these applications is incorporated herein by reference in its entirety.

The invention claimed is:

1. An electric unit attached to a power unit including a motor-generator, the power unit being disposed in a power unit mounting chamber adapted to be formed at a front of a vehicle and separated from a vehicle cabin by a partition wall, the electric unit comprising:
   a high-voltage component including an electric power conversion device of a relatively high voltage, the electric power conversion device converting an electric power between a DC electric power and an AC electric power for the motor-generator; and
   a low-voltage component including a control device of a relatively low voltage, the control device controlling the electric power conversion device, wherein
   the high-voltage component and the low-voltage component are accommodated in an accommodation case,
   inside the accommodation case, the high-voltage component is arranged toward the front of the vehicle, and the low-voltage component is arranged toward a rear of the vehicle,
   the accommodation case has a high-voltage component accommodation portion and a low-voltage accommodation portion in which the high-voltage component and the low-voltage component are accommodated, respectively, and
   the low-voltage component is formed such that at least one of the following conditions is satisfied: a height dimension of the low-voltage component is larger than a height dimension of the high-voltage component accommodation portion; and a width dimension of the low-voltage component is larger than a width dimension of the high-voltage component accommodation portion.

2. The electric unit according to claim 1, wherein
the high-voltage component including the electric power conversion device is composed of a power module including a plurality of switching power elements, a smoothing capacitor, a driver board, and a bus bar connecting the power module and an input/output terminal of the motor-generator, and the low-voltage component including the control device is composed of a control board,
the power module and the driver board are arranged in a stack at a central position of a power module board adapted to constitute a bottom portion of the accommodation case, the bus bar and the smoothing capacitor are arranged on the power module board respectively on one side and the other side in a left-right direction of the vehicle, and the control board is arranged on the power module board so as to be located more toward the rear of the vehicle than the power module, the driver board, the bus bar, and the smoothing capacitor are,
a resultant assembly is turned upside down and an opening of the accommodation case is joined to a housing of the motor-generator, and
a cooler is joined to an upward back surface of the power module board.

3. The electric unit according to claim 1, wherein
a wall region of the accommodation case toward the rear of the vehicle is provided with a region adapted to have a smaller thickness dimension than a wall portion therearound, the wall region interfering with the partition wall at a time of a collision of the vehicle.

4. The electric unit according to claim 1, wherein
a wall region of the accommodation case toward the rear of the vehicle is provided with a region adapted to project more toward the rear of the vehicle than a wall portion therearound does, the wall region interfering with the partition wall at a time of a collision of the vehicle.

5. The electric unit according to claim 2, wherein
the power module board adapted to constitute the bottom portion of the accommodation case is formed to project more toward the rear of the vehicle than a rear end portion of the accommodation case does.

6. The electric unit according to claim 2, wherein
a connector adapted to supply an electric power to the control board is provided to the control board, the connector being arranged between the control board and a rear end side of the accommodation case.

* * * * *